United States Patent [19]

Takamura

[11] Patent Number: 5,178,683
[45] Date of Patent: Jan. 12, 1993

[54] MICROWAVE PLASMA CVD APPARATUS
[75] Inventor: Fumio Takamura, Kamifukuoka, Japan
[73] Assignee: New Japan Radio Co., Ltd., Tokyo, Japan
[21] Appl. No.: 671,317
[22] Filed: Mar. 19, 1991
[30] Foreign Application Priority Data
  Mar. 30, 1990 [JP] Japan .................. 2-80838
[51] Int. Cl.⁵ ............... C23C 16/48; C23C 16/50
[52] U.S. Cl. .......................... 118/723; 156/345
[58] Field of Search ............... 118/723; 156/345
[56] References Cited
  FOREIGN PATENT DOCUMENTS
  0019549 11/1980 European Pat. Off. .
  3712971 11/1988 Fed. Rep. of Germany .
  2575151 6/1986 France .
  64-11403 1/1989 Japan .
  64-24094 1/1989 Japan .

Primary Examiner—Richard Bueker
Attorney, Agent, or Firm—Armstrong & Kubovcik

[57] ABSTRACT

A microwave CVD apparatus comprises a rectangular applicator with microwave inlets, a bell jar with an inlet and an outlet for reaction gas arranged in the applicator, and a sample-receiving table. Reaction gas is introduced into the bell jar and plasma of the reaction gas is generated therein. At least one of walls of the applicator is movable so as to change distribution of plasma intensity continuously, so that material is uniformly deposited on the whole surface of the sample.

10 Claims, 4 Drawing Sheets

MICROWAVE PLASMA CVD APPARATUS

BACKGROUND OF THE INVENTION

The present invention relates to a microwave plasma CVD apparatus in which microwave is supplied into an applicator, plasma of reaction gas (for example, mixed gas of hydrogen and hydrocarbon, mixed gas of silane and nitrogen, or the like) is generated in a bell jar provided in the applicator, and a sample is exposed in the plasma atmosphere for a long time to deposit material such as diamond on the surface of the sample.

FIGS. 5 and 6 show the structure of an example of a conventional microwave plasma CVD apparatus.

FIG. 5 is an explanatory view showing the structure of the apparatus shown from a microwave travel direction. FIG. 6 is an explanatory view of the same shown from a direction perpendicular to the microwave travel direction. In the drawings, numeral 101 is an applicator allowing microwaves to enter therein from a plurality of directions, numeral 102 is a bell jar, numeral 103 is a circular sample such as a silicon wafer, and numeral 104 is a rotary sample-receiving table. The rotary sample-receiving table 104 is arranged in the bell jar 102 comprising a silica tube provided in the applicator 101. The applicator 101 is composed of walls fixed by the welding or the like.

In using the above apparatus, the inner pressure of the bell jar 102 is set at about $10^{-5}$ Torr by exhaust, and a mixed gas of, for example, hydrogen and hydrocarbon or carbon dioxide is charged into the bell jar 102 to a pressure of about 10 to 40 Torr. Then, microwave is supplied into the applicator 101 to generate plasma of the mixed gas in the bell jar 102.

FIGS. 7 and 8 show distribution of plasma intensity in the plasma CVD apparatus shown in FIG. 6 along the microwave travel direction. In the drawings, numeral 107 is plasma. When the sample 103 is placed on the sample-receiving table 104 and the table 104 is rotated in order to expose the sample 103 in the plasma atmosphere, material such as diamond is deposited on the surface of the sample 103.

In the conventional plasma CVD apparatus, however, the applicator is composed of walls (ceiling and side walls) fixed by the welding as stated above to form a rectangular space, so that only plasma having a single intensity distribution is generated. When a film is formed on the sample 103 under this distribution of plasma, since the sample 103 is rotated about the center of the table 104 so that exposure time of a peripheral portion of the sample 103 in the plasma atmosphere is shorter than that of a central portion thereof, film thickness of the peripheral portion becomes thinner than that of the central portion. Accordingly, there has been a problem that the conventional plasma CVD apparatus cannot make samples with uniform film thickness.

The present invention was made to solve the above problem, and it is an object of the present invention to provide a microwave plasma CVD apparatus capable of uniformly depositing material on a sample by continuously changing the distribution of plasma intensity.

SUMMARY OF THE INVENTION

In accordance with the present invention, there is provided a microwave plasma CVD apparatus comprising a rectangular applicator having microwave inlets and forming a cavity resonator, a bell jar arranged in the applicator and having an inlet and an outlet for reaction gas, and a sample-receiving table arranged in the bell jar, wherein microwave and reaction gas are introduced into the bell jar to generate plasma of the reaction gas, material is deposited on the surface of the sample, and at least one of the walls of the rectangular applicator is made movable.

In the apparatus of the present invention, distribution of plasma intensity is continuously changed by moving the walls so that plasma can be uniformly distributed on the whole surface of the sample, resulting in uniform deposition of material on the whole surface of the sample.

DETAILED DESCRIPTION

Figure 1:
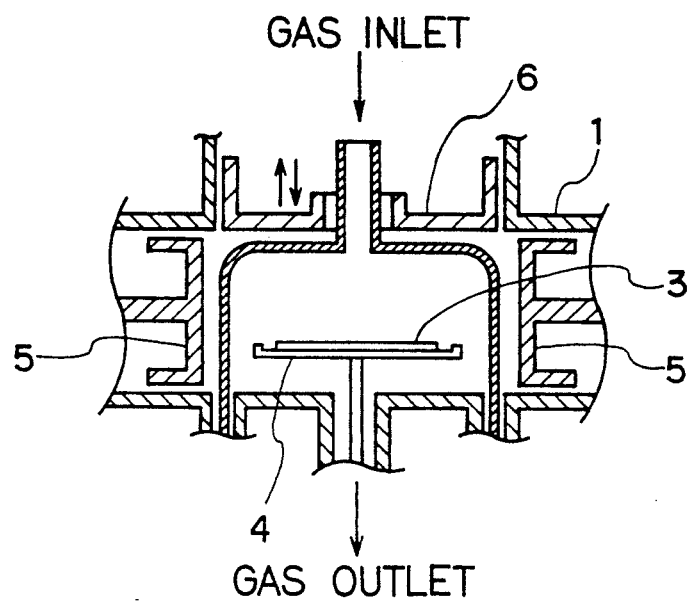
FIG. 1 is an explanatory view showing structure of an embodiment of the present invention shown from a microwave travel direction.
Figure 2:
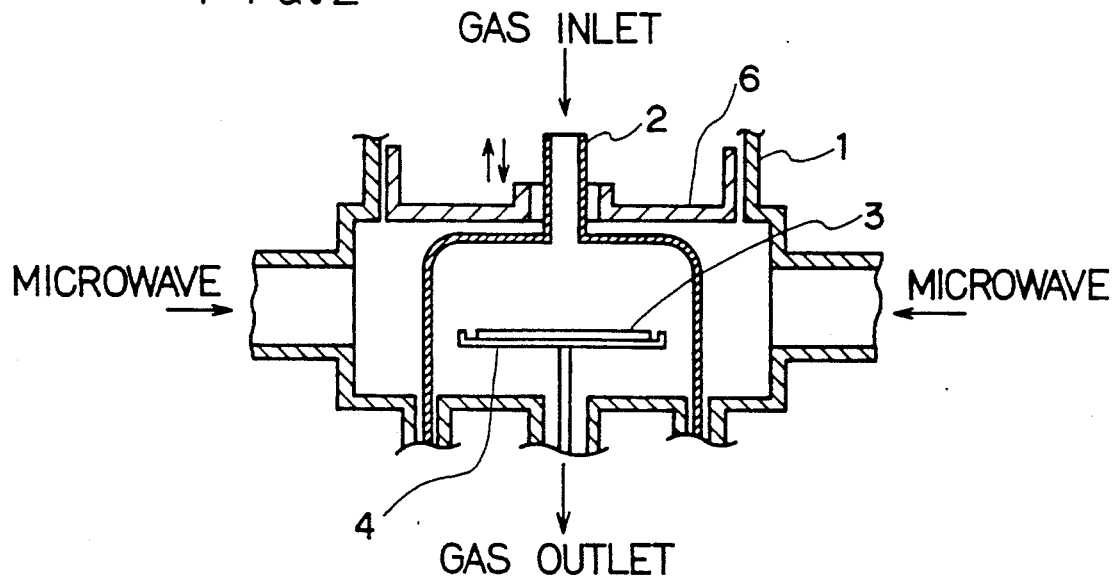
FIG. 2 is an explanatory view showing structure of the embodiment of FIG. 1 shown from a direction perpendicular to the microwave travel direction.

FIGS. 1 and 2 show structure of an embodiment of an apparatus of the present invention. FIG. 1 is an explanatory view showing structure of an embodiment shown from a microwave travel direction, and FIG. 2 is an explanatory view showing structure of an embodiment shown from a direction perpendicular to the microwave travel direction. In the drawings, numeral 1 is an applicator forming a cavity resonator in which microwaves can be supplied thereinto from a plurality of directions and walls (side walls, ceiling and bottom wall) are made movable. In the present specification, the term "wall" includes a side wall, a top wall (i.e. ceiling), and a bottom wall. Numeral 2 is a bell jar, numeral 3 is a sample, numeral 4 is a rotary sample-receiving table, numeral 5 is a movable side wall, and numeral 6 is a movable ceiling.

In the above embodiment, microwave can be supplied into the applicator 1 from two directions, and the bell jar 2 is airtightly arranged in the applicator 1 comprising movable side walls 5 and movable ceiling 6. In the bell jar 2, the rotary sample-receiving table 4 on which the sample 3 is to be placed is arranged. The table 4 is rotated by a driving mechanism (not shown) placed outside the applicator 1.

After inner pressure of the bell jar 2 is set at about $10^{-5}$ Torr by exhaust, reaction gas is introduced into the bell jar 2 from the upper portion thereof and the inner pressure is controlled in the range of 10 to 40 Torr.

While the sample-receiving table 4 is rotated at a speed in the range of 4 to 20 r.p.m., microwaves are supplied into the applicator 1 from two directions to generate plasma of reaction gas in the bell jar 2.

After a predetermined time passes from the beginning of generation of plasma, the distribution of plasma intensity is continuously changed by moving the movable side walls 5 or movable ceiling 6, whereby material is deposited on the sample 3.

By continuously changing the distribution of plasma intensity, mean intensity of plasma on the surface of the sample 3 for a certain period is kept uniform on every point whereby material is uniformly deposited on the whole surface of the sample 3.

Figure 3:
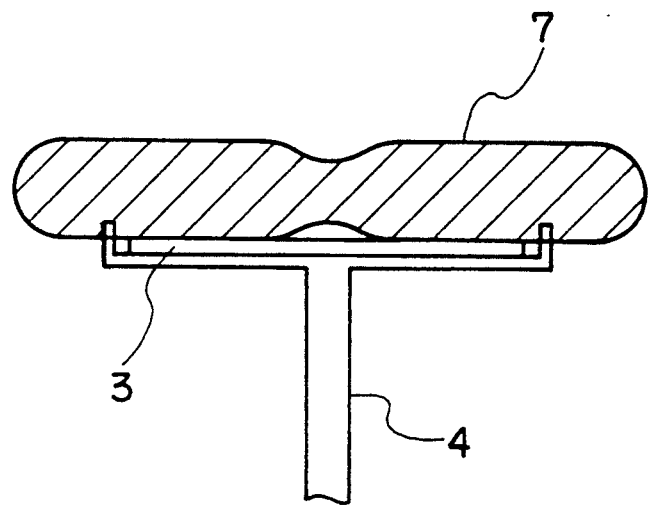
FIGS. 3 and 4 are explanatory views showing change in distribution of plasma intensity in the apparatus of the present invention observed by moving movable sidewalls.
Figure 4:
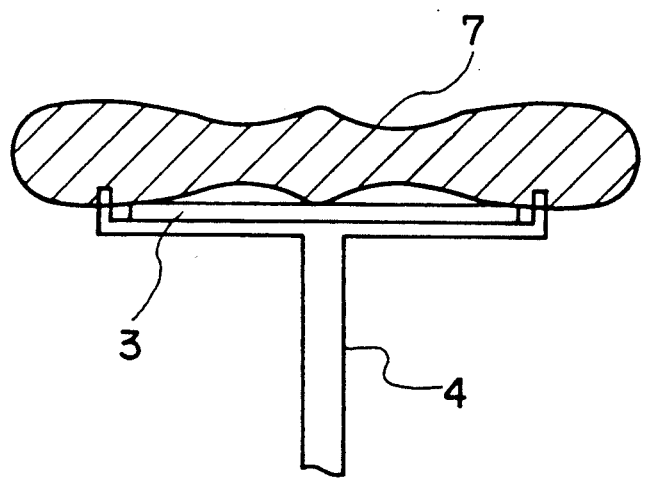
Figure 5:
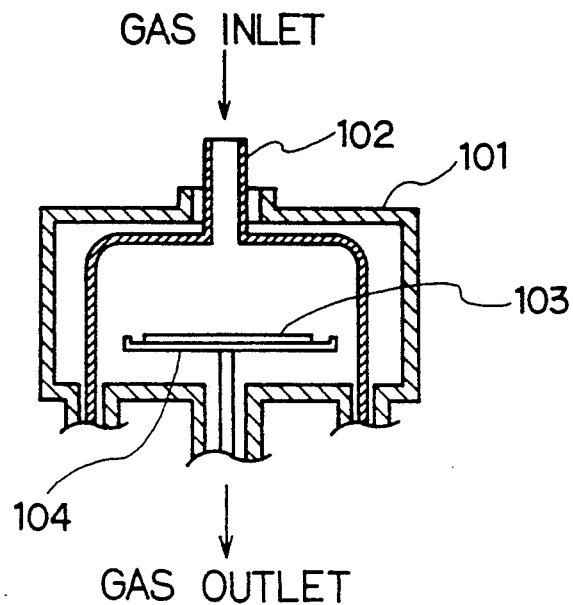
FIG. 5 is an explanatory view showing structure of a conventional plasma CVD apparatus shown from a microwave travel direction.
Figure 6:
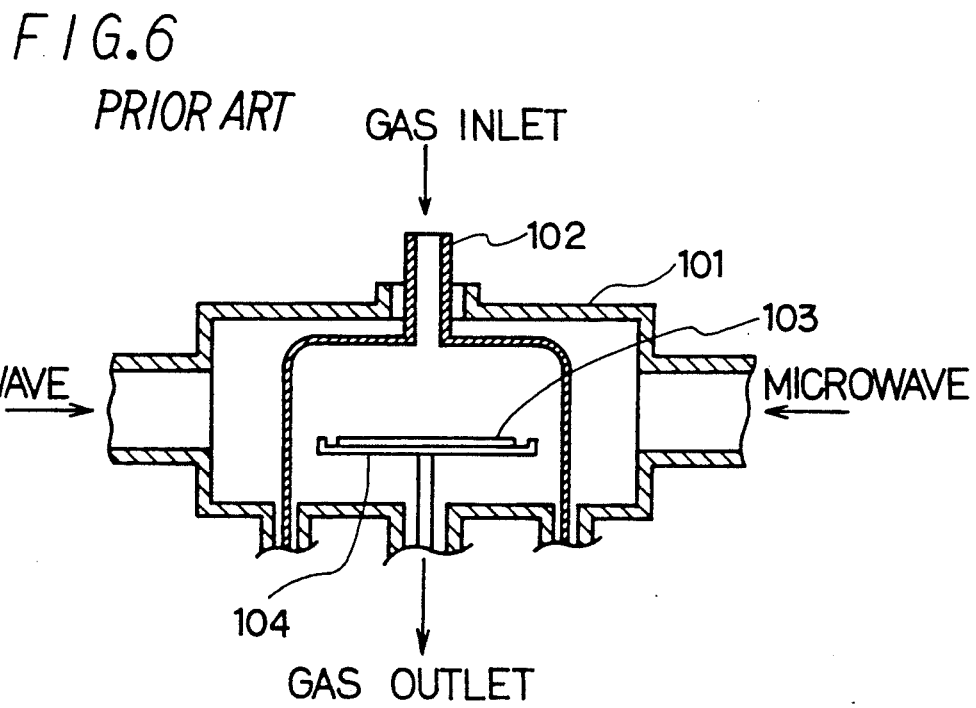
FIG. 6 is an explanatory view showing structure of a conventional plasma CVD apparatus shown from a direction perpendicular to the microwave travel direction.
Figure 7:
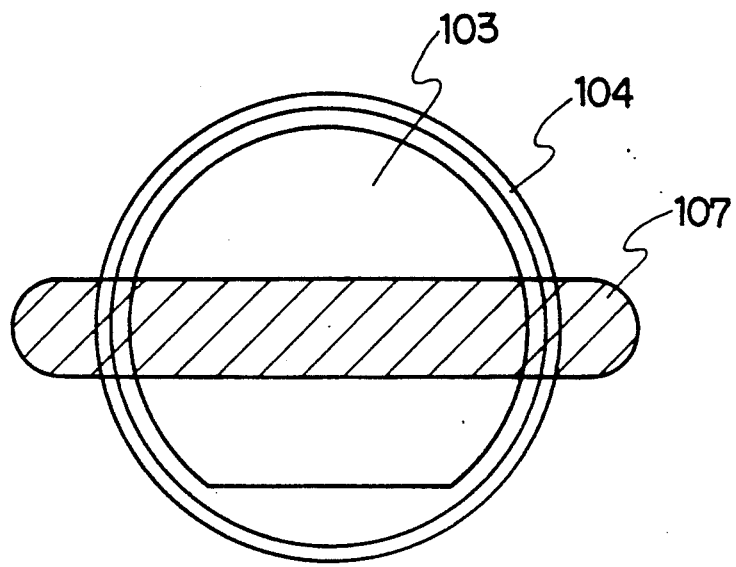
FIGS. 7 and 8 are explanatory views showing distributions of plasma intensity in a conventional plasma CVD apparatus.
Figure 8:
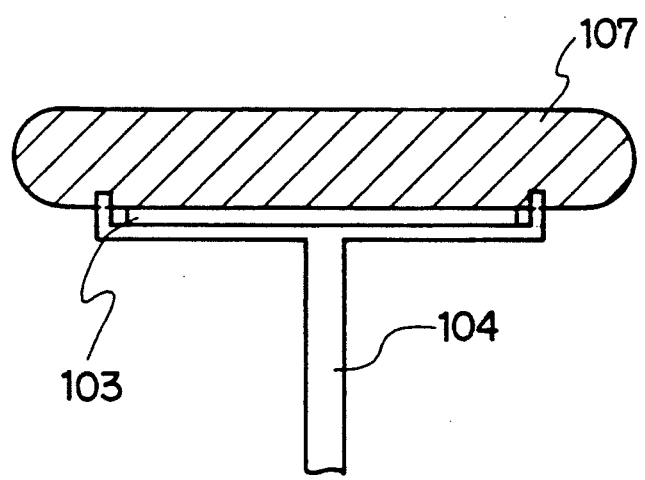

FIGS. 3 and 4 show examples of change in distribution of plasma intensity due to movement of the movable side walls 5.

Plasma shown in FIG. 3 is generated when the distance between side walls and the distance between a ceiling and a bottom wall are so designed as to make electric field mode in a cavity to be $TE_{21}$. When the distance between side walls is enlarged, distribution of plasma intensity gradually changes from distribution shown in FIG. 3 to that shown in FIG. 4. It is considered that such change in plasma intensity is caused because electric field mode in the cavity changes from $TE_{21}$ to $TE_{31}$.

In general, electric field mode in the cavity changes from $TE_{1n}$ to $TE_{2n}$, $TE_{3n}$, ..., $TE_{kn}$ (wherein n is integar) with enlargement of distance between side walls. Similarly, electric field mode in the cavity changes from $TE_{m1}$ to $TE_{m2}$, ..., $TE_{ml}$ (wherein m is integar) with enlargement of distance between the ceiling and bottom wall.

Leakage of microwaves from the gaps formed by providing the movable side walls 5 and the movable ceiling 6 can be prevented by providing the movable side walls 5 and the movable ceiling 6 with choke constructions.

In addition, when the table 4 is so made as to move up and down, plasma intensity on the surface of the sample 3 is further equalized.

Further, more uniform film can be obtained by moving plasma also in the direction of microwave travel direction by a phase converter from the outside.

As is mentioned above, according to the present invention, the distribution of plasma intensity can be continuously changed, whereby a uniform film is deposited on a sample and the production efficiency of film deposition on a sample is improved.

What is claimed is:

1. A microwave CVD apparatus comprising:

an applicator having microwave inlets and forming a cavity resonator;

a bell jar arranged in the applicator and having an inlet and an outlet for reaction gas;

reaction gas supply means for supplying gas to said bell jar for passing from said inlet to said outlet of said bell jar;

microwave supply means for supplying microwaves to said bell jar for generating plasma from said gas in said bell jar; and a sample-receiving table arranged in the bell jar for holding a sample;

wherein when microwave and reaction gas are introduced into the bell jar, plasma of the reaction gas is generated and material is deposited on the surface of the sample;

and wherein said applicator comprises at least two walls for forming said cavity resonator, one of said at least two walls is movable for access to said sample-receiving table within said bell jar, and at least one further wall of said at least two walls of the applicator is movable for changing a distribution of plasma intensity within said bell jar.

2. The apparatus of claim 1, wherein the microwave inlets are provided on a plurality of walls of the applicator.

3. The apparatus of claim 1, wherein the microwave inlets are provided on opposite side walls of the applicator.

4. The apparatus of claim 1, wherein said at least two walls of said applicator comprise a top wall, a bottom wall and at least two side walls.

5. The apparatus of claim 4, wherein said applicator has a substantially rectangular cross section and wherein said at least two side walls of said applicator comprise four walls defining said rectangular cross section.

6. The apparatus of claim 4, wherein said top wall and said bottom wall are movable.

7. The apparatus of claim 6, wherein said at least two side walls are movable.

8. The apparatus of claim 5, wherein said top wall, bottom wall, and four side walls are all movable, said bottom wall movable for access to said sample-receiving table, and said top wall and four side walls for changing said distribution of plasma intensity within said bell jar.

9. The apparatus of claim 1, wherein said sample-receiving table is rotatable.

10. The apparatus of claim 9, wherein said sample-receiving table is further movable in a linear direction within said bell jar.

* * * * *